United States Patent
Shinohara

(10) Patent No.: US 11,821,524 B2
(45) Date of Patent: Nov. 21, 2023

(54) COMBINATION OF CYLINDER AND PISTON RING

(71) Applicant: KABUSHIKI KAISHA RIKEN, Tokyo (JP)

(72) Inventor: Akio Shinohara, Tokyo (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 0 days.

(21) Appl. No.: 17/757,092

(22) PCT Filed: Nov. 19, 2020

(86) PCT No.: PCT/JP2020/043244
§ 371 (c)(1),
(2) Date: Jun. 9, 2022

(87) PCT Pub. No.: WO2021/124788
PCT Pub. Date: Jun. 24, 2021

(65) Prior Publication Data
US 2023/0003300 A1    Jan. 5, 2023

(30) Foreign Application Priority Data
Dec. 17, 2019  (JP) ................................. 2019-227759

(51) Int. Cl.
C23C 14/06 (2006.01)
F16J 9/26 (2006.01)
F16J 9/28 (2006.01)

(52) U.S. Cl.
CPC .. *F16J 9/26* (2013.01); *F16J 9/28* (2013.01)

(58) Field of Classification Search
CPC . C23C 14/0605; C23C 28/046; C23C 28/343; F16J 10/04; F16J 9/26; F16J 9/00; C01B 32/05; F02F 5/00
See application file for complete search history.

(56) References Cited

U.S. PATENT DOCUMENTS

2002/0102398 A1* 8/2002 Shi ...................... C23C 14/0605
                                                           419/48
2014/0137733 A1* 5/2014 Sekiya ...................... F16J 9/26
                                                           92/172

(Continued)

FOREIGN PATENT DOCUMENTS

CN    104169555 A    11/2014
CN    106062441 A    10/2016

(Continued)

OTHER PUBLICATIONS

Dec. 22, 2020, International Search Report issued in the International Patent Application No. PCT/JP2020/043244.

(Continued)

*Primary Examiner* — George C Jin
*Assistant Examiner* — Teuta B Holbrook
(74) *Attorney, Agent, or Firm* — KENJA IP LAW PC

(57) ABSTRACT

The present disclosure is a combination of a cylinder and a piston ring, the combination including a cylinder of an internal combustion engine and a piston ring sliding on an inner peripheral surface of the cylinder. The piston ring has an outer peripheral surface sliding on the inner peripheral surface of the cylinder, and the outer peripheral surface is formed of a substantially hydrogen-free amorphous carbon coating. The Vickers hardness Hd of the amorphous carbon coating and the Vickers hardness Hb of the inner peripheral surface of the cylinder satisfy Hd+Hb≤2500 HV. The ratio ID/IG of the peak intensity of the D band to the peak intensity of the G band in a Raman spectrum obtained by measuring the amorphous carbon coating by Raman spectroscopy is 0.60 or more and 1.33 or less.

4 Claims, 1 Drawing Sheet

(56) References Cited

U.S. PATENT DOCUMENTS

| | | | |
|---|---|---|---|
| 2017/0175622 A1 | 6/2017 | Avelar Araujo et al. | |
| 2019/0100434 A1* | 4/2019 | Moriguchi | C01B 32/05 |
| 2020/0256277 A1* | 8/2020 | Kawai | F16J 10/00 |

FOREIGN PATENT DOCUMENTS

| | | | | |
|---|---|---|---|---|
| JP | 2004010923 A * | 1/2004 | | F16C 33/043 |
| JP | 2004010923 A | 1/2004 | | |
| JP | 2007162099 A | 6/2007 | | |
| JP | 2014129826 A | 7/2014 | | |
| JP | 2016037639 A | 3/2016 | | |
| JP | 6533858 B1 | 6/2019 | | |
| JP | 2019116677 A * | 7/2019 | | |
| WO | WO-2008149824 A1 * | 12/2008 | | C23C 14/0605 |
| WO | 2009069703 A1 | 6/2009 | | |
| WO | WO-2013035634 A1 * | 3/2013 | | C01B 32/05 |
| WO | 2013137060 A1 | 9/2013 | | |
| WO | 2016021671 A1 | 2/2016 | | |

OTHER PUBLICATIONS

Oct. 12, 2021, Decision to Grant a Patent issued by the Japan Patent Office in the corresponding Japanese Patent Application No. 2019-227759.

Jul. 7, 2022, Office Action issued by the Intellectual Property India in the corresponding Indian Patent Application No. 202217017793.

May 17, 2022, International Preliminary Report on Patentability issued in the International Patent Application No. PCT/JP2020/043244.

Jul. 12, 2022, Office Action issued by the China National Intellectual Property Administration in the corresponding Chinese Patent Application No. 202080073039.X.

Jan. 3, 2023, Office Action issued by the Intellectual Property India in the corresponding Indian Patent Application No. 202217017793.

Jan. 12, 2023, Office Action issued by the China National Intellectual Property Administration in the corresponding Chinese Patent Application No. 202080073039.X.

* cited by examiner

COMBINATION OF CYLINDER AND PISTON RING

TECHNICAL FIELD

The disclosure relates to a combination of a cylinder and a piston ring, in which the combination includes a cylinder of an internal combustion engine and a piston ring sliding on an inner peripheral surface of the cylinder.

BACKGROUND

In recent years, internal combustion engines, mainly automobile engines, have been strongly required to improve fuel efficiency. For this reason, research and development have been widely conducted to reduce size, weight, friction loss, and the like. For example, it is attempted to use an aluminum alloy with low specific gravity for a cylinder, and to apply a hard carbon coating with a low friction coefficient to an outer peripheral sliding surface of a piston ring.

The hard carbon coating is made of, for example, amorphous carbon called diamond-like carbon (DLC). The structural essential of DLC is a mixture of diamond bonds ($sp^3$ bonds) and graphite bonds ($sp^2$ bonds) as bonds of carbon. Therefore, DLC is suitable as a protective coating for the piston ring because DLC has hardness, wear resistance, thermal conductivity, and chemical stability similar to diamond, while having solid lubricity similar to graphite.

On the other hand, some aluminum alloy cylinders have a cast iron liner that is cast into an inner peripheral surface sliding directly with the piston ring, or have an iron-based thermal spray coating formed by spraying iron-based alloy powder onto the inner peripheral surface. In particular, cylinder bore thermal spraying technology is attracting attention because the technology is expected to reduce overall bore temperature and improve uniformity of the bore temperature due to improved heat transfer performance, and to improve wear resistance and scuffing resistance to the piston ring.

Patent Literature (PTL) 1 describes, "to provide a combination of a cylinder bore and a piston ring with high scuffing resistance, high wear resistance, and low friction loss, even under severe sliding conditions due to high loads on an engine, by using cylinder bore thermal spraying technology that enables the use of aluminum alloy casting by ordinary die casting", "a combination of a cylinder and a piston ring, the combination comprising a cylinder of an internal combustion engine and a piston ring sliding on an inner peripheral surface of the cylinder, wherein at least a sliding surface side of the cylinder is composed of an aluminum alloy containing 8 mass % or more and 22 mass % or less of Si and one or more types of particles selected from groups of Si, $Al_2O_3$, and $SiO_2$ with a particle diameter of 3 μm or more, and at least an outer peripheral surface of the piston ring is coated with a hard carbon coating composed only of hydrogen and carbon".

CITATION LIST

Patent Literature

PTL 1: WO 2013/137060 A1

SUMMARY

Technical Problem

Conventionally, it is considered that the higher the hardness of a DLC coating formed on an outer peripheral surface of a piston ring, the higher the wear resistance, and the less the DLC coating wears due to sliding on a cylinder bore surface. Therefore, it is common to use a DLC coating with a high hardness of 3000 HV to 4000 HV in Vickers hardness. On the other hand, as a result of further research by the inventor, it is found that when a piston ring in which a DLC coating having elastic deformation capability and a predetermined hardness is formed on an outer peripheral sliding surface is slid on a cylinder made of a material other than aluminum alloys, such as a cylinder with an iron-based thermal spray coating on a bore surface, the amount of wear of the DLC coating increases.

It could be helpful to provide a combination of a cylinder and a piston ring with which the amount of wear of a hard carbon coating that forms an outer peripheral surface of the piston ring can be reduced according to the hardness of an inner peripheral surface of the cylinder, regardless of a material to be applied to the inner peripheral surface of the cylinder.

Solution to Problem

In order to solve the above problem, the inventor has made a thorough investigation. It is found that the amount of wear of a DLC coating is significantly reduced by satisfying all the following conditions:

(i) An outer peripheral surface of a piston ring is formed of a substantially hydrogen-free amorphous carbon coating (DLC coating).

(ii) The sum of the Vickers hardness of the amorphous carbon coating and the Vickers hardness of a bore surface of a cylinder is set to 2500 HV or less.

(iii) The ratio ID/IG of the peak intensity of the D band to the peak intensity of the G band in a Raman spectrum obtained by measuring the amorphous carbon coating by Raman spectroscopy is set to 0.60 or more and 1.33 or less.

Based on the above findings, we provide:

(1) A combination of a cylinder and a piston ring, the combination including a cylinder of an internal combustion engine and a piston ring configured to slide on an inner peripheral surface of the cylinder, wherein the piston ring has an outer peripheral surface sliding on the inner peripheral surface of the cylinder, and the outer peripheral surface is formed of a substantially hydrogen-free amorphous carbon coating, the Vickers hardness Hd of the amorphous carbon coating and the Vickers hardness Hb of the inner peripheral surface of the cylinder satisfy Hd+Hb≤2500 HV, and the ratio ID/IG of the peak intensity of the D band to the peak intensity of the G band in a Raman spectrum obtained by measuring the amorphous carbon coating by Raman spectroscopy is 0.60 or more and 1.33 or less.

(2) The combination of a cylinder and a piston ring according to above (1), wherein the Vickers hardness Hd of the amorphous carbon coating is greater than the Vickers hardness Hb of the inner peripheral surface of the cylinder.

(3) The combination of a cylinder and a piston ring according to above (1) or (2), wherein the Vickers hardness Hb of the inner peripheral surface of the cylinder is 150 HV or more and 800 HV or less.

(4) The combination of a cylinder and a piston ring according to any one of above (1) to (3), wherein the difference between the Vickers hardness Hd of the amorphous carbon coating and the Vickers hardness Hb of the inner peripheral surface of the cylinder satisfies 1750 HV or less.

Advantageous Effect

According to the combination of a cylinder and a piston ring of the disclosure, it is possible to reduce the amount of wear of the hard carbon coating that forms the outer peripheral surface of the piston ring, according to the hardness of the inner peripheral surface of the cylinder, regardless of a material to be applied to the inner peripheral surface of the cylinder.

BRIEF DESCRIPTION OF THE DRAWINGS

In the accompanying drawings:

FIGS. 1A and 1B are schematic views illustrating a combination of a cylinder and a piston ring according to one of the disclosed embodiments, in which FIG. 1A is a cross sectional view of a cylinder 10, and FIG. 1B is a cross sectional perspective view of a piston ring 20.

DETAILED DESCRIPTION

Figure 1A:
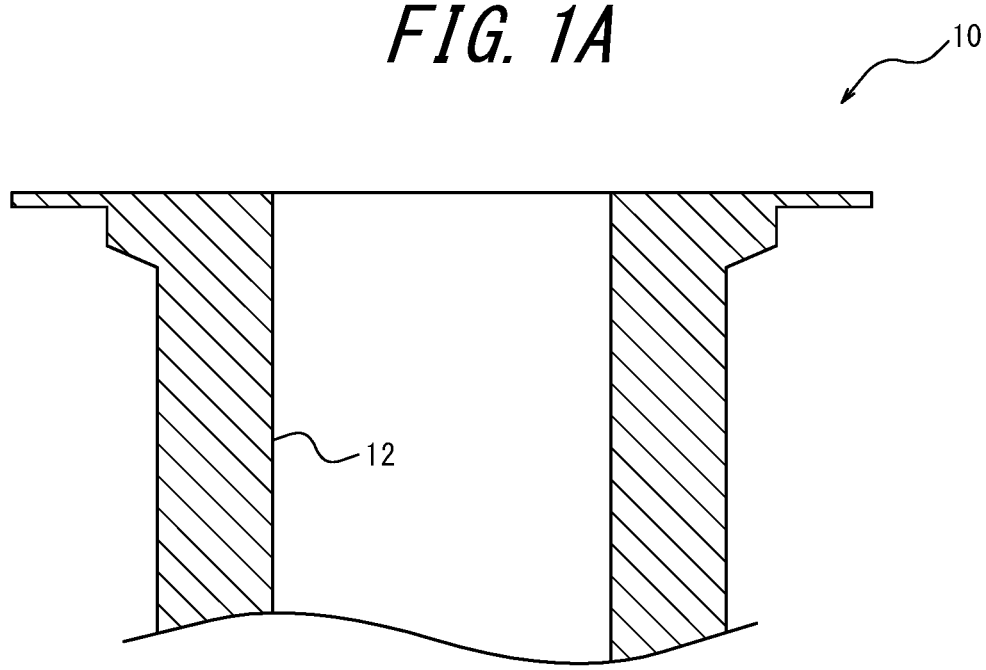
Figure 1B:
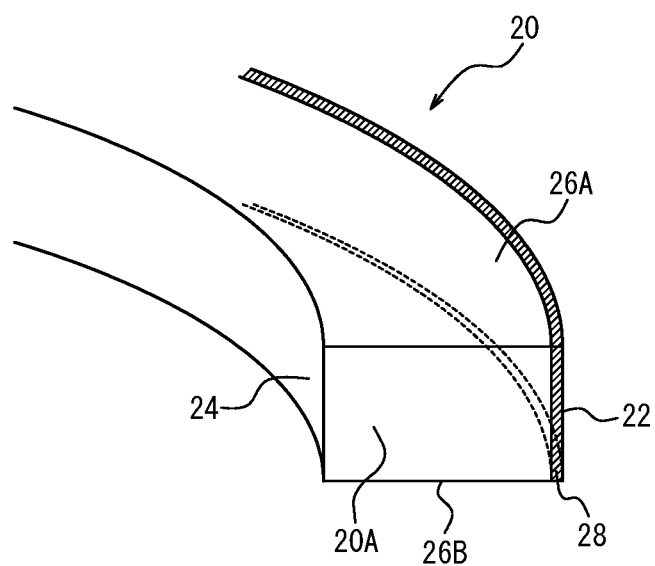

With reference to FIGS. 1A and 1B, a combination of a cylinder and a piston ring according to one of the embodiments includes a cylinder 10 for an internal combustion engine and a piston ring 20 sliding on an inner peripheral surface 12 of the cylinder 10. The piston ring 20 is externally fitted onto a known piston (not shown), and when the piston reciprocates within the cylinder 10, an outer peripheral surface 22 of the piston ring 20 slides on the inner peripheral surface 12 of the cylinder 10. The piston ring 20 is composed of a base member 20A and a substantially hydrogen-free amorphous carbon coating (DLC coating) 28. The piston ring 20 has the shape of a ring formed by four surfaces, i.e. the outer peripheral surface 22, an inner peripheral surface 24, and top and bottom surfaces 26A and 26B. The outer peripheral surface 22 is formed of the DLC coating 28.

The base member 20A of the piston ring 20 is not specifically limited, and, for example, silicon chrome steel (JIS SWOSC-V) for compression rings, martensitic stainless steel (JIS SUS440B), or other known or arbitrary materials can be used.

In the present embodiment, the amorphous carbon coating 28 is assumed to be made only of DLC that is substantially free of hydrogen. In recent years, low-viscosity oil containing MoDTC is frequently used as oil for internal combustion engines. It is known that when this oil is used in a high-temperature and sliding environment, a tribo-coating composed mainly of molybdenum disulfide is formed. The formation of the tribo-coating causes reduction in frictional force between the piston ring 20 and the inner peripheral surface 12 of the cylinder. However, when a DLC coating containing hydrogen is used, a MoDTC component attacks the DLC coating containing hydrogen, resulting in increased wear. For this reason, in the present embodiment, a DLC coating that does not contain hydrogen is used. Amorphous carbon can be confirmed by Raman spectral measurement using a Raman spectrophotometer (Ar laser). Herein, "substantially hydrogen-free" means that a hydrogen content of the amorphous carbon coating is 2 atomic % or less, and the balance substantially consists only of carbon.

Method for Measuring Hydrogen Content of Amorphous Carbon Coating

The hydrogen content of the amorphous carbon coating is evaluated by Rutherford Backscattering Spectrometry (RBS)/Hydrogen Forward Scattering Spectrometry (HFS) for the amorphous carbon coating formed on a flat sliding surface or a sliding surface with sufficiently large curvature. In contrast, the hydrogen content is evaluated by a combination of RBS/HFS and Secondary Ion Mass Spectrometry (SIMS) for the amorphous carbon coating formed on a non-flat sliding surface such as the outer peripheral surface of piston ring. Although RBS/HFS is a known method for analyzing coating composition, RBS/HFS is not applicable to analysis of non-flat surfaces, so RBS/HFS and SIMS are combined in the following way.

First, as a reference specimen with a flat surface, a carbon coating to be a target of measurement of a reference value is formed on a flat mirror-polished specimen (quenched SKH51 disk, φ 25×thickness of 5 mm, hardness of HRC 60 to 63).

The coating is deposited on the reference specimen by a reactive sputtering method, with a hydrocarbon gas such as methane, Ar, and $H_2$ introduced as atmospheric gases. By changing an introduced $H_2$ flow rate and/or a hydrocarbon gas flow rate, the amount of hydrogen contained in the carbon coating is adjusted. In this way, carbon coatings that are composed of hydrogen and carbon with different hydrogen contents are formed, and the hydrogen content and carbon content of the carbon coatings are evaluated by RBS/HFS.

Next, the above specimen is analyzed by SIMS to measure the secondary ion intensity of hydrogen and carbon. Here, SIMS analysis can be applied even to a non-flat surface, for example, a coating formed on the outer peripheral surface of the piston ring. Therefore, for the same coating on the reference specimen with the carbon coating, an experimental equation (calibration curve) that indicates the relationship between the hydrogen content and the carbon content (unit: atomic %) obtained by RBS/HFS and the ratio in the secondary ion intensity between hydrogen and carbon obtained by SIMS is obtained. In this way, the hydrogen content and the carbon content can be calculated from the secondary ion intensity of hydrogen and carbon measured by SIMS on the outer peripheral surface of the actual piston ring. Note that, the value of the secondary ion intensity by SIMS is an average value of the secondary ion intensities of individual elements observed at a depth of at least 20 nm or more from a surface of the carbon coating and within a 50 nm square area.

Cylinder and Piston Ring

In the present embodiment, it is fundamental that the Vickers hardness Hd of the DLC coating 28 and the Vickers hardness Hb of the inner peripheral surface 12 of the cylinder should satisfy Hd+Hb≤2500 HV, and the ratio ID/IG of the peak intensity of the D band to the peak intensity of the G band in a Raman spectrum obtained by measuring the DLC coating 28 by Raman spectroscopy should be 0.60 or more and 1.33 or less. This allows to reduce the amount of wear of the DLC coating 28, regardless of a material of the inner peripheral surface of the cylinder. Specifically, ID/IG is calculated by separating the Raman spectrum into the D band with a peak near 1350 $cm^{-1}$ and the G band with a peak near 1550 $cm^{-1}$ by curve fitting of the Raman spectrum with a Gaussian function, and then obtaining the ratio of the peak intensity of the D band to the peak intensity of the G band. Note that, ID/IG on which we focus attention is the ratio of the peak intensities, and not the ratio of peak areas.

The inventor believes that an action that produces this effect is as follows. That is, one of main causes of wear of the DLC coating and the inner peripheral surface of the cylinder is considered to be wear particles that are generated in no small amount when the piston ring and the cylinder slide. When the DLC coating and the inner peripheral surface of the cylinder slide in the presence of the wear particles, it is thought that the amount of wear increases due to intervening of the wear particles. Furthermore, in recent years, internal combustion engines, especially those for automobile engines, have been equipped with exhaust recirculation devices, turbochargers, or the like to improve thermal efficiency. Both types of the devices improve the thermal efficiency of the internal combustion engine, but on the other hand, introduce a lot of soot produced after combustion into a combustion chamber. Thus, there are a lot of wear particles and soot intervening between the piston ring and the cylinder. In such an environment, the DLC coating of the piston ring and the inner peripheral surface of the cylinder slide against each other, and the soot, the wear particles, and other foreign matter get trapped. This is thought to cause wear of the DLC coating and the inner peripheral surface of the cylinder.

Here, by setting Hd+Hb to 2500 HV or less, plastic deformation performance is considered to be improved between the piston ring and the inner peripheral surface of the cylinder, i.e. contact surfaces. Therefore, when foreign matter such as soot is bitten during sliding, the DLC coating and the cylinder deform appropriately on the contact surfaces to mitigate damage caused by the bitten foreign matter and reduce the wear of the DLC coating. However, even if the contact surfaces have sufficient deformation capability, the damage caused by the bitten foreign matter may cause carbon bonds to break in a part of the DLC coating, causing crystal grains to fall out and wear to progress.

Here, by setting the ratio ID/IG of the peak intensities of the DLC coating to 0.60 or more, crystal grains of the DLC coating become finer, which reduces the volume of the crystal grains that fall out when foreign matter is bitten into the coating, thereby reducing wear.

Therefore, it is important to set Hd+Hb to 2500 HV or less, and the ratio ID/IG of the peak intensities to 0.60 or more. Note that, we set the hardness of the DLC coating to a value that can easily release force of biting soot by plastic deformation, using a hardness index that quantifies the ability of plastic deformation, such as Vickers hardness. In this way, by controlling the ratio ID/IG of the peak intensities and the sum of the Vickers hardness of the DLC coating and the inner peripheral surface of the cylinder, damage caused by scratching by the foreign matter such as soot and wear of the DLC coating can be mitigated. In addition, concave portions are formed on the DLC coating and the inner peripheral surface of the cylinder in which plastic deformation has occurred, and it is thought that these concave portions allow oil to enter the contact surfaces and improve lubrication, and allow the bitten foreign matter such as soot to exit with ease. From the viewpoint of obtaining the aforementioned wear reduction effect more reliably, ID/IG is preferably 0.60 or more and 1.10 or less. ID/IG is more preferably 0.70 or higher, and even more preferably 0.80 or higher. However, when ID/IG exceeds 1.33, the size of the grains becomes excessively small and the strength of the DLC coating itself becomes insufficient, and the amount of wear increases.

A material for the cylinder 10 is not specifically limited as long as the material for the cylinder 10 is set so that the Vickers hardness Hb of the inner peripheral surface 12 satisfies Hd+Hb≤2500 HV in relation to the Vickers hardness Hd of the DLC coating 28. For example, iron-based materials, especially chromium-containing steel, are preferable as the material for the inner peripheral surface of the cylinder. Furthermore, the steel material may be tempered to match mechanical properties required for the inner peripheral surface of the cylinder, as various hardnesses can be obtained by quenching, annealing, tempering, and the like. According to the present embodiment, even if the hardness of the inner peripheral surface of the cylinder is changed in order to obtain mechanical properties other than hardness, wear resistance is less likely to deteriorate. The cylinder may also be made of another material such as a copper alloy, aluminum alloy, magnesium alloy, beryllium alloy, or the like. Furthermore, the structure of the cylinder itself may be made of cast iron or the like, and the inner peripheral surface of the cylinder may be coated with nickel, chrome, copper, or the like by plating. As a matter of course, the inner peripheral surface may also be coated with a thermal spray material. As the thermal spray material, an iron-based material, stainless steel, tungsten carbide, alumina, or the like can be assumed. As a thermal spraying method, wire arc spraying (LDS), which is low cost, wire plasma spraying (PTWA), which produces a dense coating, or the like may be used. The hardness of the inner peripheral surface of the cylinder can be adjusted according to the type of the material selected and its additive components. Taking the thermal spraying method as an example, if an iron-based raw material is used, the hardness can be changed by adjusting the amount of carbon added in the raw material. The hardness range of the inner peripheral surface of the cylinder may be 70 HV to 1000 HV.

Among the above, it is preferable to use a cylinder whose inner peripheral surface has a Vickers hardness Hb of 150 HV or more and 800 HV or less. If Hb is less than 150 HV, scratches and wear are likely to occur on the inner peripheral surface of the cylinder when large foreign matter is bitten thereinto. On the other hand, if Hb exceeds 800 HV, the cylinder becomes excessively hard and tends to have cracking. It also increases aggressiveness to the piston ring.

The Vickers hardness Hd of the DLC coating 28 is not specifically limited as long as the Vickers hardness Hd of the DLC coating 28 is set so as to satisfy Hd+Hb≤2500 HV in relation to the Vickers hardness Hb of the inner peripheral surface 12 of the cylinder. However, while the inner peripheral surface 12 of the cylinder is subjected to sliding on a two-dimensional surface, the DLC coating 28 is subjected to sliding in a one-dimensional line-shaped region and thus receives a large load due to the sliding. Therefore, the Vickers hardness Hd of the DLC coating 28 is preferably higher than the Vickers hardness Hb of the inner peripheral surface 12 of the cylinder. Specifically, the Vickers hardness Hd of the DLC coating 28 is preferably 1000 HV or higher, and more preferably 1500 HV or higher. In addition, the difference, that is, the subtraction of the Vickers hardness Hb of the inner peripheral surface 12 of the cylinder from the Vickers hardness Hd of the DLC coating 28 is preferably 1750 HV or less, so that the wear reduction can be demonstrated more stably. In particular, when the ratio ID/IG of the peak intensities of the DLC coating 28 is 0.70 or higher, it is more preferable that the difference in hardness is 1750 HV or less.

The Vickers hardness Hd of the DLC coating can be measured with a Vickers hardness tester (for example, FLC-50VX produced by FUTURE-TECH CORP.). An indenter is pressed into a surface of the DLC coating and the size of an indentation formed is used to determine the hardness. An indentation load is set so that an indentation depth becomes ⅕ or less of the thickness of the DLC coating in order to reduce the effect of the hardness of a substrate. In the case of a thin coating of several μm, it is difficult to measure the hardness with the above Vickers hardness tester without being affected by the substrate, so for example, indentation hardness (HIT) is measured with a nanoindentation hardness tester (for example, ENT-1100a produced by ELIONIX INC.) with a load of several mN to several tens of mN so that the indentation depth becomes ⅕ or less of the coating thickness, and then is converted into the Vickers hardness using a conversion equation HV=HIT (N/mm$^2$)× 0.0945. In a case in which a measurement surface is not smooth, accurate hardness cannot be obtained due to the influence of roughness. Therefore, the measurement surface should be polished with diamond film or the like before measurement.

The Vickers hardness Hb of the inner peripheral surface of the cylinder is measured in accordance with the Vickers hardness test method of the JIS standard (JIS Z 2244) or the ISO standard (ISO 6507-4).

The thickness of the DLC coating 28 is not specifically limited, but is preferably 1 μm or more and 30 μm or less. If the thickness is less than 1 μm, the coating is excessively thin and wears out. If the coating thickness exceeds 30 μm, the coating has increased internal stress and easily becomes chipped. Note that, the thickness of the DLC coating is measured by the following method. That is, the piston ring with the DLC coating is cut in a thickness direction of the DLC coating, and a cut cross section is smoothed by being polished with a diamond film. The polished surface is then observed under a microscope to measure the thickness of the DLC coating.

In the present embodiment, the DLC coating 28 may be formed using a PVD method, such as ion plating by vacuum arc discharge using a carbon target, for example. The PVD method can form a DLC coating with excellent wear resistance that contains almost no hydrogen. Note that, it is preferable to use a filtered arc ion plating method in which arc discharge is used in a high vacuum or in an atmosphere with an inert gas such as Ar gas, without introducing a gas containing hydrogen as a constituent element, such as a hydrocarbon gas in a vacuum, and a filter to remove carbon micro-particles, such as a magnetic filter with bending magnetic force lines, is equipped.

Here, the Vickers hardness Hd of the DLC coating 28 and the ratio ID/IG of the peak intensities in a Raman spectrum of the DLC coating 28 can be controlled by adjusting a bias voltage applied to the base member of the piston ring during coating deposition and the temperature of the base member during coating deposition.

Specifically, when the bias voltage is increased, the kinetic energy of carbon ions impacting the base member of the piston ring is increased, so carbon is not deposited on a surface of the base member but is repelled from the surface of the base member by sputtering. As a result, a DLC coating formed has a coarse structure, and thus has reduced hardness. When the bias voltage is increased, the impact of ions destroys or disturbs the bonds of carbon in the coating, resulting in a smaller crystal size, which increases the value of ID and makes ID/IG larger.

When the temperature of the base member during coating deposition is increased, three-dimensional carbon bonds decrease due to heat and become easier to take on a stable two-dimensional structure, which decreases connections in a bonding network and reduces hardness. In addition, as the temperature of the base member during coating deposition is increased, a graphite component of the carbon bonds increases. As a result, the value of ID increases and ID/IG becomes larger.

As described above, setting a higher bias voltage and temperature makes it easier to form a DLC coating that satisfies the conditions of the disclosure. As bias application methods, direct current, pulsed, floating potential, and the like can be used, and multiple methods may be combined. In particular, pulse bias and floating potential are suitable bias application methods because these methods do not excessively increase the temperature of the member.

Intermediate Layer

Note that, the aforementioned embodiment exemplifies the piston ring in which the DLC coating is formed directly on the base member of the piston ring, but the disclosure is not limited to this. For example, a metallic intermediate layer with a thickness of 0.1 μm to 1.0 μm may be formed between the base member of the piston ring and the DLC coating to improve adhesion. A material of the metallic intermediate layer may be one or more elements selected from groups composed of chromium, titanium, and tungsten, or carbides of these elements. Furthermore, to prevent scuffing even in a case in which the DLC coating wears out due to operating environment, a hard metal nitride with high scuffing resistance may be formed with a thickness of 1 μm to 30 μm between the base member of the piston ring and the DLC coating, or between the base member and the metal intermediate layer. The hard metal nitride may be chromium nitride, titanium nitride, or carbides of these materials.

EXAMPLES

Experimental Example 1

To form specimens corresponding to the piston rings, columns made of SUJ2 with φ 6 mm×length of 12 mm were used as base members, and DLC coatings of various levels illustrated in Table 1 were formed on curved surfaces of the base members. The DLC coatings were deposited using a vacuum arc deposition system with various bias voltages and base member temperatures. The hydrogen content and Vickers hardness Hd of the DLC coatings illustrated in Table 1 are values measured by the method already described. The values of ID/IG of the DLC coatings illustrated in Table 1 were measured using an inViaReflex Raman spectrometer produced by Renishaw plc. Specifically, the wavelength of an Ar ion excitation laser was 532.0 nm, a laser output was 50 mW, an objective lens magnification was 100, and measurement was performed through a beam attenuator. Obtained Raman spectra were subjected to peak separation using two Gaussian functions in the range of 900 $cm^{-1}$ to 1900 $cm^{-1}$. Of separated peaks, the peak near 1350 $cm^{-1}$ was assigned as the D band and the peak near 1550 $cm^{-1}$ was assigned as the G band. The ratio ID/IG of the peak intensity of the D band to the peak intensity of the G band was calculated.

Various metal flat plates of 20 mm×20 mm×3.5 mm with different surface hardnesses were prepared as specimens corresponding to the cylinders. The "surface hardness Hb of mating member of cylinder equivalent" illustrated in Table 1 indicates values obtained by measuring the Vickers hardness of surfaces of the various metal flat plates using the method already described. Materials of the metal flat plates were selected from carbon-containing iron-based materials, aluminum alloys, and the like, and the hardness was adjusted by adjusting heat treatment conditions.

Sliding Test

A reciprocating sliding test was conducted with the curved surface of the column, which is the specimen corresponding to the piston ring, in linear contact with the surface of the metal flat plate, which is the specimen corresponding to the cylinder. The surface of the metal flat plate was dripped with engine oil (base oil) containing no additives at 120° C beforehand. Test conditions were as follows.

Load: 360 N
Speed during reciprocating sliding: 1500 rpm
Amplitude during reciprocating sliding: 3 mm
Test duration: 2 hours The amount of wear of the DLC coating was determined by the following method. The outer peripheral shape of the column before and after the test was measured in a sliding direction using a stylus-type roughness measuring instrument (SURFCOM1400D produced by TOKYO SEIMITSU CO., LTD.). Then, by superimposing the shapes before and after the test, the wear depth of the coating was determined in micrometers. The amount of wear of a mating member was determined by the following method. The surface shape of the metal flat plate after the test was measured using the stylus-type roughness measuring instrument (SURFCOM1400D produced by TOKYO SEIMITSU CO., LTD.) in a sliding direction near the center of a sliding width. The deepest part of a concave portion from a line connecting non-slid portions was determined in micrometers as a wear depth.

TABLE 1

| No. | Hydrogen content of DLC coating (atomic %) | Hardness Hd of DLC coating (HV) | Surface hardness Hb of mating member of cylinder equivalent (HV) | Hd + Hb (HV) | Hd − Hb (HV) | ID/IG | Amount of wear of coating (pm) | Amount of wear of mating member (pm) | Category |
|---|---|---|---|---|---|---|---|---|---|
| 1 | 0.5 | 1779 | 400 | 2179 | 1379 | 0.79 | 0.61 | 0.3 or less | Example |
| 2 | 0.5 | 2066 | 400 | 2466 | 1666 | 0.62 | 0.39 | 0.3 or less | Example |
| 3 | 0.5 | 2000 | 400 | 2400 | 1600 | 0.90 | 0.55 | 0.3 or less | Example |
| 4 | 0.5 | 2300 | 105 | 2405 | 2195 | 0.60 | 0.13 | 1.20 | Example |
| 5 | 0.5 | 1800 | 105 | 1905 | 1695 | 0.88 | 0.10 | 1.10 | Example |
| 6 | 0.5 | 1647 | 150 | 1797 | 1497 | 1.20 | 0.30 | 0.3 or less | Example |
| 7 | 0.5 | 2270 | 194 | 2464 | 2076 | 0.64 | 1.64 | 0.3 or less | Example |
| 8 | 0.5 | 1610 | 194 | 1804 | 1416 | 1.01 | 0.34 | 0.3 or less | Example |
| 9 | 0.5 | 1800 | 194 | 1994 | 1606 | 0.88 | 0.42 | 0.3 or less | Example |
| 10 | 0.5 | 2307 | 400 | <u>2707</u> | 1907 | <u>0.58</u> | 2.48 | 0.3 or less | Comparative example |
| 11 | 0.5 | 2300 | 226 | <u>2526</u> | 2074 | <u>0.59</u> | 3.01 | 0.3 or less | Comparative example |
| 12 | 0.5 | 2300 | 750 | <u>3050</u> | 1550 | 0.60 | 4.03 | 0.3 or less | Comparative example |
| 13 | 0.5 | 2300 | 221 | <u>2521</u> | 2079 | <u>0.59</u> | 2.91 | 0.3 or less | Comparative example |
| 14 | 0.5 | 4927 | 524 | <u>5451</u> | 4403 | <u>0.36</u> | 5.01 | 0.3 or less | Comparative example |
| 15 | 0.5 | 2300 | 300 | <u>2600</u> | 2000 | <u>0.52</u> | 3.13 | 0.3 or less | Comparative example |
| 16 | 0.5 | 1082 | 400 | 1482 | 682 | 1.33 | 0.33 | 0.3 or less | Example |
| 17 | 0.5 | 2348 | 400 | <u>2748</u> | 1948 | 0.74 | 2.09 | 0.3 or less | Comparative example |

Underlines indicate values out of range of disclosure.

It is apparent from Table 1 that in the DLC coatings of the examples that are substantially free of hydrogen and satisfy Hd+Hb≤2500 HV and ID/IG of 0.60 or more and 1.33 or less, the amounts of wear of the DLC coatings are very low.

Experimental Example 2

To form specimens corresponding to the piston rings, columns made of SUJ2 with φ 6 mm×length of 12 mm were used as base members, and DLC coatings of two levels illustrated in Table 2 were formed on curved surfaces of the base members. As specimens of a mating member corresponding to the cylinder, flat plates of 20 mm×20 mm×3.5 mm made of carbon steel with a hardness of 270 HV were prepared. A sliding test similar to that of the experimental example 1 was conducted to determine the amount of wear of the DLC coating and the amount of wear of the mating member. However, in the experimental example 2, the test was conducted with carbon black power sprinkled between the curved surface of the column and a test surface of the flat plate. The amount of wear of the DLC coating and the amount of wear of the mating member were expressed as an index with level No. 2 being 1.00, which corresponds to a comparative example.

TABLE 2

| No. | Hydrogen content of DLC coating (atomic%) | Hardness Hd of DLC coating (HV) | Surface hardness Hb of mating member of cylindrical equivalent (HV) | Hd + Hb (HV) | Hd − Hb (HV) | ID/IG | Index to amount of wear of coating | Index to amount of wear of mating member | Category |
|---|---|---|---|---|---|---|---|---|---|
| 1 | 0.5 | 1800 | 270 | 2070 | 1500 | 0.88 | 0.28 | 0.20 | Example |
| 2 | 0.5 | 2300 | 270 | <u>2570</u> | 2000 | <u>≤0.60</u> | 1.00 | 1.00 | Comparative example |

Underlines indicate values out of range of disclosure.

It is apparent from Table 2 that in No. 1 compared to No. 2, the amount of wear of the DLC coating was reduced to about 28%, and the amount of wear of the mating member was also reduced to 20%.

Industrial Applicability

According to the combination of the cylinder and the piston ring of the disclosure, the amount of wear of the hard carbon coating forming the outer peripheral surface of the piston ring can be reduced according to the hardness of the inner peripheral surface of the cylinder, regardless of the material to be applied to the inner peripheral surface of the cylinder.

REFERENCE SIGNS LIST 10 cylinder
12 inner peripheral surface (bore surface) of cylinder
20 piston ring
20A base member of piston ring
22 outer peripheral surface of piston ring
24 inner peripheral surface of piston ring
26A top surface (top side surface) of piston ring
26B bottom surface (bottom side surface) of piston ring
28 amorphous carbon coating

The invention claimed is:
1. A combination of a cylinder and a piston ring, the combination comprising a cylinder of an internal combustion engine and a piston ring configured to slide on an inner peripheral surface of the cylinder, wherein
the piston ring has an outer peripheral surface sliding on the inner peripheral surface of the cylinder, and the outer peripheral surface is formed of a substantially hydrogen-free amorphous carbon coating consisting of DLC, a Vickers hardness Hd of the amorphous carbon coating and a Vickers hardness Hb of the inner peripheral surface of the cylinder satisfy Hd+Hb 2500 HV, a difference between the Vickers hardness Hd of the amorphous carbon coating and the Vickers hardness Hb of the inner peripheral surface of the cylinder satisfies 1750 HV or less, and a ratio ID/IG of a peak intensity of a D band to a peak intensity of a G band in a Raman spectrum obtained by measuring the amorphous carbon coating by Raman spectroscopy is 0.60 or more and 1.33 or less.

2. The combination of a cylinder and a piston ring according to claim 1, wherein the Vickers hardness Hd of the amorphous carbon coating is greater than the Vickers hardness Hb of the inner peripheral surface of the cylinder.

3. The combination of a cylinder and a piston ring according to claim 2, wherein the Vickers hardness Hb of the inner peripheral surface of the cylinder is 150 HV or more and 800 HV or less.

4. The combination of a cylinder and a piston ring according to claim 1, wherein the Vickers hardness Hb of the inner peripheral surface of the cylinder is 150 HV or more and 800 HV or less.

* * * * *